(12) United States Patent
Notani

(10) Patent No.: US 6,795,333 B2
(45) Date of Patent: Sep. 21, 2004

(54) SEMICONDUCTOR MEMORY DEVICE STORING TERNARY DATA SIGNAL

(75) Inventor: Hiromi Notani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 64 days.

(21) Appl. No.: 10/337,387

(22) Filed: Jan. 7, 2003

(65) Prior Publication Data

US 2004/0037108 A1 Feb. 26, 2004

(30) Foreign Application Priority Data

Aug. 22, 2002 (JP) .................................... 2002-241950

(51) Int. Cl.$^7$ .................... G11C 11/00; G11C 15/00
(52) U.S. Cl. .................................... 365/154; 365/49
(58) Field of Search .............................. 365/154, 156, 365/49, 202

(56) References Cited

U.S. PATENT DOCUMENTS

| | | | |
|---|---|---|---|
| 5,841,874 A | | 11/1998 | Kempke et al. |
| 6,262,932 B1 | * | 7/2001 | Nguyen .................. 365/230.05 |
| 6,522,562 B2 | * | 2/2003 | Foss .............................. 365/49 |
| 6,674,660 B2 | * | 1/2004 | Shau ............................. 365/49 |

* cited by examiner

Primary Examiner—Anh Phung
(74) Attorney, Agent, or Firm—Leydig, Voit & Mayer, Ltd.

(57) ABSTRACT

A memory cell in the SRAM has three storing/holding states, i.e., a state where two storage nodes store 0, 1, a state where the two storage nodes store 1, 0, and a state where the two storage nodes store 1, 1. Therefore, the number of memory cells can be reduced by one half compared to the conventional case in which two memory cells were required to store three types of data signals.

16 Claims, 12 Drawing Sheets

FIG.7
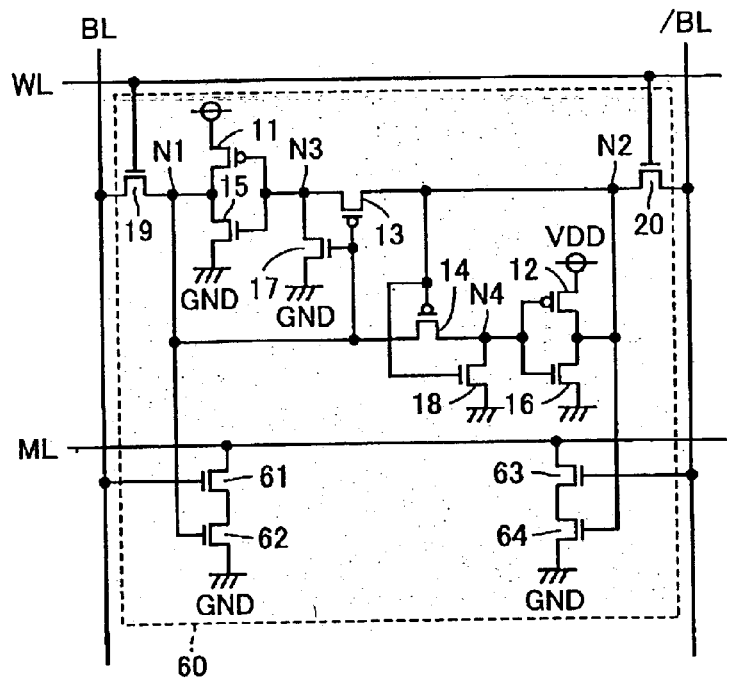
FIG.8
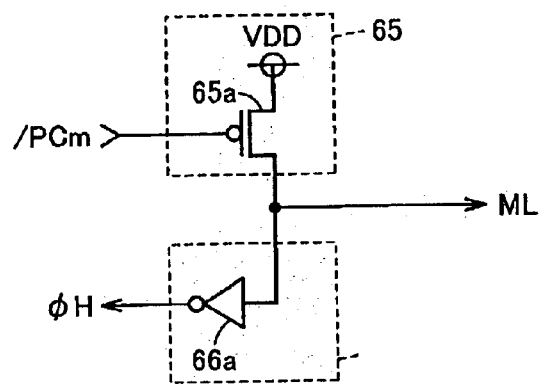
FIG.9
| D1(N1,N2) | D2(BL,/BL) | | |
|---|---|---|---|
| | "0"(0,1) | "1"(0,1) | "x"(0,0) |
| "0"(0,1) | "1" | "0" | "1" |
| "1"(1,0) | "0" | "1" | "1" |
| "x"(1,1) | "0" | "0" | "1" |

| D1(N1,N2) | (N3,N4) | D2(BL,/BL) | | |
|---|---|---|---|---|
| | | "0"(0,1) | "1"(1,0) | "x"(1,1) |
| "0"(0,1) | (1,0) | "1" | "0" | "0" |
| "1"(1,0) | (0,1) | "0" | "1" | "0" |
| "x"(1,1) | (0,0) | "1" | "1" | "1" |

| D1(N1,N2) | (N3,N4) | D2(BL,/BL) | | |
|---|---|---|---|---|
| | | "0"(0,1) | "1"(1,0) | "x"(0,0) |
| "0"(0,1) | (1,0) | "1" | "0" | "1" |
| "1"(1,0) | (0,1) | "0" | "1" | "1" |
| "x"(1,1) | (0,0) | "1" | "1" | "1" |

| D1(N1,N2) | D2(BL,/BL) | | |
|---|---|---|---|
| | "0"(0,1)/(1,0) | "1"(1,0)/(0,1) | "x"(0,0) |
| "0"(0,1) | "1" | "1" | "1" |
| "1"(1,0) | "1" | "1" | "1" |
| "x"(1,1) | "0" | "0" | "1" |

| D1(N1,N2) | (N3,N4) | D2(BL,/BL) | | |
|---|---|---|---|---|
| | | "0"(0,1) | "1"(1,0) | "x"(0,0) |
| "0"(0,1) | (1,0) | "1" | "0" | "1" |
| "1"(1,0) | (0,1) | "0" | "1" | "1" |
| "x"(0,0) | (1,1) | "0" | "0" | "1" |

| D1(N1,N2) | D2(BL,/BL) | | |
|---|---|---|---|
| | "0"(1,0) | "1"(0,1) | "x"(1,1) |
| "0"(0,1) | "1" | "0" | "0" |
| "1"(1,0) | "0" | "1" | "0" |
| "x"(0,0) | "1" | "1" | "1" |

| D1(N1,N2) | D2(BL,/BL) | | |
|---|---|---|---|
| | "0"(1,0) | "1"(0,1) | "x"(0,0) |
| "0"(0,1) | "1" | "0" | "1" |
| "1"(1,0) | "0" | "1" | "1" |
| "x"(0,0) | "1" | "1" | "1" |

| D1(N1,N2) | (N3,N4) | D2(BL,/BL) | | |
|---|---|---|---|---|
| | | "0"(0,1)/(1,0) | "1"(1,0)/(0,1) | "x"(0,0) |
| "0"(0,1) | (1,0) | "1" | "1" | "1" |
| "1"(1,0) | (0,1) | "1" | "1" | "1" |
| "x"(0,0) | (1,1) | "0" | "0" | "1" |

US 6,795,333 B2

SEMICONDUCTOR MEMORY DEVICE STORING TERNARY DATA SIGNAL

BACKGROUND OF THE INVENTION

1. Field of the Invention

The present invention relates to a semiconductor memory device, and particularly, to a semiconductor memory device arranged at a crossing portion of a word line and first and second bit lines.

2. Description of the Background Art

FIG. 24 is a circuit diagram showing the configuration of a memory cell 90 in a conventional static random access memory (hereinafter referred to as SRAM). In FIG. 24, memory cell 90 includes P-channel MOS transistors 91, 92 and N-channel MOS transistors 93 to 96. P-channel MOS transistors 91, 92 are connected between the lines of a power- supply potential VDD and storage nodes N91, N92 respectively, and have gates connected to storage nodes N92, N91 respectively. N-channel MOS transistors 93, 94 are connected between storage nodes N91, N92 and the lines of a ground potential GND respectively, and have gates connected to storage nodes N92, N91 respectively. N-channel MOS transistors 95, 96 are connected between storage nodes N91, N92 and bit lines BL, /BL respectively, and have gates both connected to a word line WL. MOS transistors 91, 93 form an inverter that applies an inversion signal of a signal at storage node N92 to storage node N91. MOS transistors 92, 94 form an inverter that applies an inversion signal of a signal at storage node N91 to storage node N92. The two inverters are connected between storage nodes N91 and N92 in back-to-back connection, forming a latch circuit.

At writing operation, word line WL is set to a logic high or an "H" level of a selective level to render N-channel MOS transistors 95, 96 conductive. If one of bit lines BL, /BL (BL for example) is set to the H level while the other bit line (/BL in this example) is set to a logic low or an "L" level in response to a write data signal, MOS transistors 91, 94 are rendered conductive while MOS transistors 92, 93 are rendered non-conductive, latching the level of storage nodes N91, N92. If word line WL is set to the L level of a non-selective level, N-channel MOS transistors 95, 96 are rendered non-conductive, and a data signal is stored into memory cell 90.

At reading operation, bit lines BL, /BL are pre-charged to the H level, and thereafter word line WL is set to the H level of the selective level. This allows current to flow out an the lines of ground potential GND from a bit line (/BL in this example) through N-channel MOS transistors 96 and 94, lowering the potential of bit line /BL. By comparing the potential of bit line BL with the potential of bit line /BL, stored data in memory cell 90 can be read out.

FIG. 25 is a circuit diagram showing the configuration of a memory cell 100 in a conventional content addressable memory (hereinafter referred to as CAM). Referring to FIG. 25, memory cell 100 is configured by adding N-channel MOS transistors 101 to 103 to memory cell 90 in FIG. 24. In CAM, a match line ML is provided per word, and a plurality of memory cells 100 corresponding to one word are connected to one match line ML. N15 channel MOS transistors 101, 102 are connected between bit lines BL, /BL and node N101 respectively, and have gates connected to storage nodes N91, N92 respectively. N-channel MOS transistor 103 is connected between match line ML and the line of ground potential GND, and has the gate; connected to node N101 arranged between N-channel MOS transistors 101 and 102.

Data writing/reading are performed using word line WL and bit line pair BL, /BL, as in the SRAM in FIG. 24. At data retrieval, match line ML is pre-charged to the H level, and thereafter an inversion data signal of a data signal to be retrieved is applied to bit lines BL, /BL. If storage data are "0" and "1," storage nodes (N91, N92) have (0, 1) and (1, 0) respectively. *If the data to be retrieved are "0" and "1," bit lines (BL, /BL) are provided with (1, 0) and (0, 1).

If, for example, the storage data is "0" and the retrieval data is "0," storage nodes (N91, N92) have (0, 1), rendering N-channel MOS transistor 101 non-conductive and N-channel MOS transistor 102 conductive. Here, bit lines (BL, /BL) have (1, 0), so that node N101 is set to the L level. Thus, N-channel MOS transistor 103 is rendered non-conductive, while match line ML remains at the H level. If the stored data is "1" whereas the retrieval data is "0," storage nodes (N91, N92) have (1, 0), rendering N-channel MOS transistor 101 conductive and N-channel MOS transistor 102 non-conductive. Here, bit lines (BL, /BL) have (1, 0), 50 that node N101 is set to the H level. Thus, N-channel MOS transistor 103 is rendered conductive, lowering match line ML to the L level.

That is, if there is even one bit of a plurality of data pieces included in one word that does not match with a retrieval word, match lines ML corresponding to that word are lowered to the L level ("0"). Only match line ML corresponding to a word having all bits matching with the retrieval word is held at the H level ("1").

Thus, each of the conventional memory cells 90 and 100 had only two types of data holding states. Accordingly, if the data signal had three values of "0," "1" and "x," two memory cells, i.e. a memory cell holding "0" or "1" and a memory cell holding "x" which indicates whether data is valid or invalid, had to be used as one set. This increased the area occupied by the memory, resulting in large power consumption.

SUMMARY OF THE INVENTION

A primary object of the present invention is, therefore, to provide a semiconductor memory device having a small occupied area and power consumption.

A semiconductor memory device according to the present invention includes first and second inverters having output nodes connected to first and second storage nodes respectively; a first switching circuit rendering conductive between the first storage node and an input node of the second inverter and applying a second potential to an input node of the first inverter if first and second potentials are applied to the first and second storage nodes respectively, rendering conductive between the second storage node and the input node of the first inverter and applying the second potential to the input node of the second inverter if the second and first potentials are applied to the first and second storage nodes respectively, and applying the second potential to each of the input nodes of the first and second inverters if the first potential is applied to each of the first and second storage nodes; and a second switching circuit rendering conductive between the first bit line and the first storage node and between the second bit line and the second storage node, in response to the word line being set to a selective level. Thus, the semiconductor memory device has three types of storing/ holding states, i.e., a state where the first and second potentials are stored into the first and second storage nodes respectively, a state where the, second and first potentials are stored into the first and second storage nodes respectively, and a state where the first potential is stored into each of the first and second storage nodes. Accordingly, compared to the conventional case where two semiconductor memory devices (memory cells) including two inverters were required to hold three kinds of data signals, the number of transistors can be reduced. This allows reduction of the occupied area. Moreover, the number of bit lines can also be reduced, so that reduction in an amount of charging/discharging of bit lines may also be expected, leading to lower power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram illustrating the configuration of a memory cell in a CAM according to the third embodiment of the invention;

FIG. 8 is a block diagram showing the configuration of a portion associated with data retrieval in CAM shown in FIG. 7;

FIG. 9 illustrates a data retrieving method for the memory cell shown in FIG. 7;

DESCRIPTION OF THE PREFERRED EMBODIMENTS

First Embodiment

Figure 1:
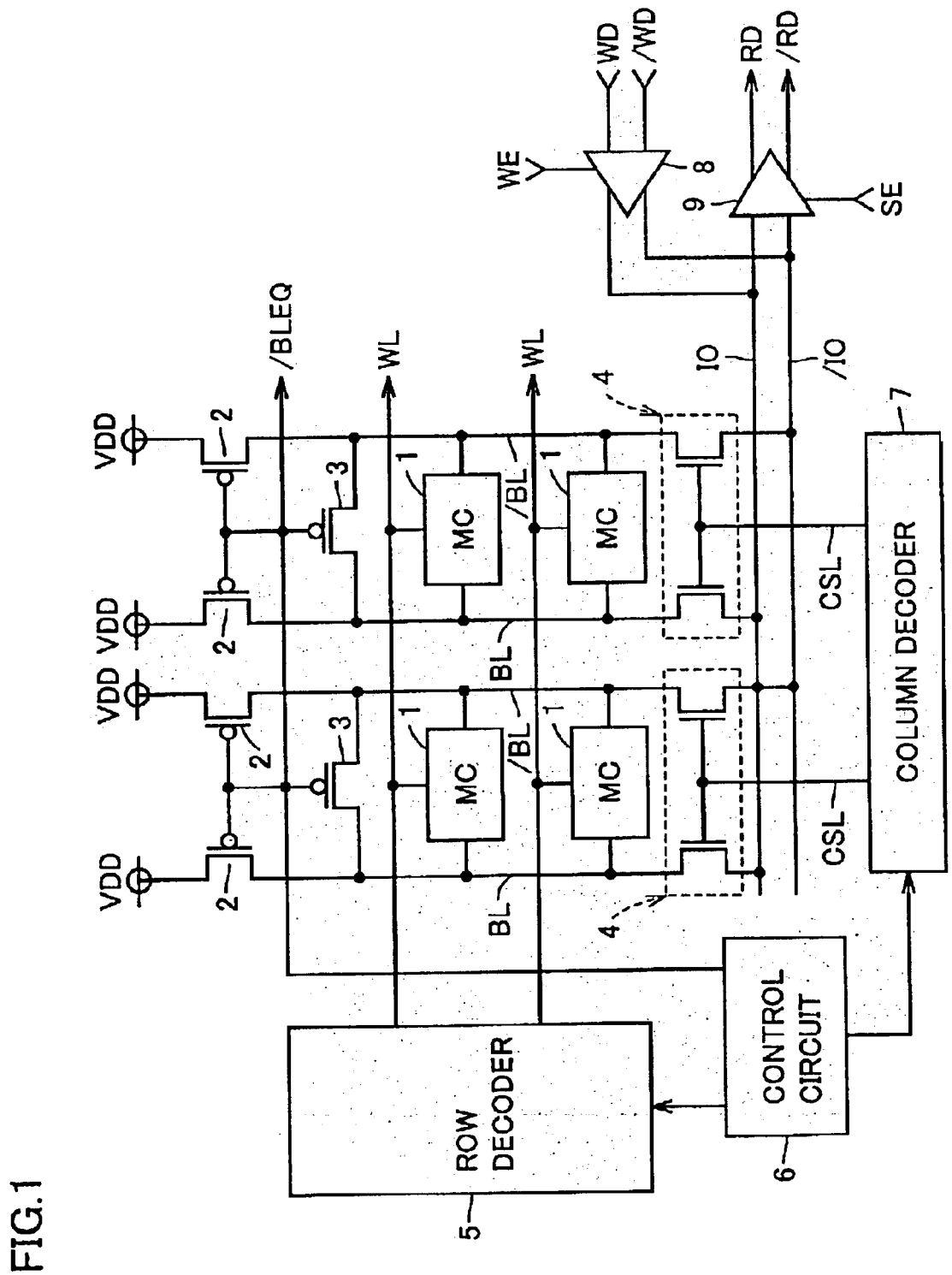
FIG. 1 is a circuit block diagram showing the entire configuration of an SRAM according to the first embodiment of the invention.

Referring to FIG. 1, the SRAM includes a plurality of memory cells (MC) 1 arranged in a matrix of rows and columns (four memory cells in two rows and two columns are shown for simplification), a word line WL provided in correspondence to each row, and a bit line pair BL, /BL provided in correspondence to each column. Each memory cell 1 is connected to corresponding word line WL and corresponding bit line pair BL, /BL, and stores a data signal having three values ("0," "1," "x").

The SRAM further includes a precharge circuit 2 provided in correspondence to each of bit lines BL and /BL, for charging a corresponding bit line BL or /BL to a prescribed potential, an equalizer 3 provided in correspondence to each of bit lines BL and /BL, for equalizing the potential between corresponding bit lines BL and /BL at reading operation, and a column selection gate 4 provided in correspondence to each of bit lines BL and /BL, for connecting corresponding bit line pair BL, /BL with a data input/output line pair IO, /IO.

Precharge circuit 2 includes a P-channel MOS transistor connected between the line of power-supply potential VDD and one end of corresponding bit line BL or /BL, the gate thereof receiving a bit line equalize signal /BLEQ. Equalizer 3 includes a P-channel MOS transistor connected between corresponding bit lines BL and /BL, the gate thereof receiving bit line equalize signal /BLEQ. Column selection gate 4 includes an N-channel MOS transistor connected between the other end of corresponding bit line BL and one end of data input/output line IO, and an N-channel MOS transistor connected between the other end of corresponding bit line /BL and one end of data input/output line /IO, the gates of the two N-channel MOS transistors being connected to one end of a column selection line CSL.

The SRAM further includes a row decoder 5, a control circuit 6, a column decoder 7, a write circuit 8 and a read circuit 9. Row decoder 5 raises any one of a plurality of word lines WL to the H level of a selective level in accordance with an externally-applied row address signal. Control circuit 6 controls the entire SRAM in accordance with an externally-applied control signal. Column decoder 7 raises any one of a plurality of column selection lines CSL to the H level of a selective level in accordance with an externally-applied column address signal.

Write circuit 8 and read circuit 9 are both connected to the other end of data input/output line pair IO, /IO. Write circuit 8 is activated in response to a signal WE being set to the H level of an activated level, to write externally-applied data signals WD, /WD into memory cell 1 selected by row decoder 5 and column decoder 7. Read circuit 9 is activated in response to a signal SE being set to the H level of the activated level, and outputs read data signals RD, /RD from memory cell 1 selected by row decoder 5 and column decoder 7 to the outside. Each of data signals WD, /WD and RD, /RD take 0, 1 or 1, 0 or 1, 1, that is, "0" "1" or "x."

The operation of the SRAM shown in FIG. 1 is now described. At writing operation, word line WL in a row designated by a row address signal is raised to the H level of the selective level by row decoder 5, activating each memory cell 1 in that row. Subsequently, column selection line CSL in a column designated by a column address signal is raised to the H level of the selective level by column decoder 7, rendering column selection gate 4 in that column conductive, and thus activated memory cell 1 is connected to write circuit 8 via, bit line pair BL, /BL and data input/output line pair IO, /IO.

Write circuit 8 sets data input/output lines IO, /IO to L and H levels, H and L levels, or H and H levels respectively, in accordance with externally-applied data signals WD, /WD, to write data into memory cell 1. If word line WL and column selection line CSL are lowered to the L level, data is stored into memory cell 1.

At reading operation, column selection line CSL designated by a column address signal is raised to the H level of the selective level, rendering column selection gate 4 in that column conductive, and thus bit line pair BL, /BL is connected to read circuit 9 via data input/output line pair IO, /IO. Subsequently, bit line equalize signal /BLEQ is set to the L level of an activated level, rendering each precharge circuit 2 and each equalizer 3 conductive to equalize the potential of each of bit lines BL, /BL. If bit line equalize signal /BLEQ is set to the H level of an inactivated level rendering each precharge circuit 2 and each equalizer 3 non-conductive, then word line WL in a row corresponding to a row address signal is raised to the H level of the selective level by row decoder 5, activating each memory cell 1 in that row. Accordingly, the potentials of bit lines BL, /BL and data input/output lines IO, /IO are set to the L and H levels, H and L levels, or H and H levels, in accordance with the data stored in memory cell 1. Read circuit 9 compares the potential of each of data input/output lines IO, /IO with a reference potential VR, and outputs data signals RD, /RD having logic levels according to the comparison result to the outside.

Figure 2:
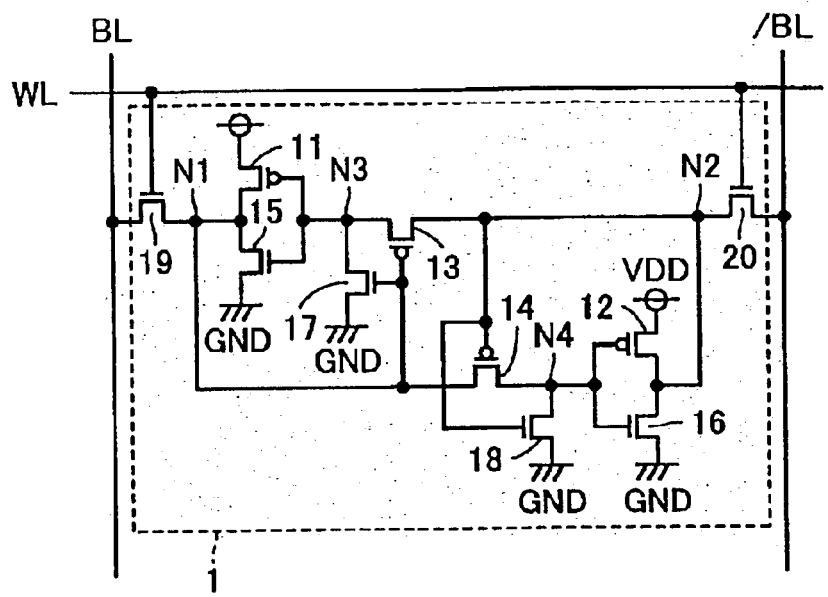
FIG. 2 is a circuit diagram showing the configuration of a memory cell shown in FIG. 1.

FIG. 2 is a circuit diagram showing the configuration of memory cell 1. In FIG. 2, memory cell 1 includes P-channel MOS transistors 11 to 14 and N-channel MOS transistors 15 to 20. P-channel MOS transistors (load transistors) 11, 12 are connected between the lines of power-supply potential VDD and storage nodes N1, N2 respectively, the gates thereof being connected to nodes N3, N4 respectively. P-channel MOS transistor (transfer gate) 13 is connected between nodes N2 and N3, the gate thereof being connected to storage node N1. P-channel MOS transistor (transfer gate) 14 is connected between nodes N1 and N4, the gate thereof being connected to storage node N2.

N-channel MOS transistors (driver transistors) 15, 16 are connected between storage nodes N1, N2 and the lines of ground potential GND respectively, the gates thereof being connected to nodes N3, N4 respectively. P-channel MOS transistor 11 and N-channel MOS transistor 15 form an inverter that applies an inversion signal of a signal appearing at node N3 to storage node N1. P-channel MOS transistor 12 and N-channel MOS transistor 16 form an inverter that applies an inversion signal of a signal appearing at node N4 to storage node N2.

N-channel MOS transistor (a pull-down transistor) 17 is connected between node N3 and the line of ground potential GND, the gate thereof being connected to storage node N1. N-channel MOS transistor (pull-down transistor) 18 is connected between node N4 and the line of ground potential GND, the gate thereof being connected to storage node N2. N-channel MOS transistor (an access transistor) 19 is connected between bit line BL and storage node N1, the gate thereof being connected to word line WL. N-channel MOS transistor (an access transistor) 20 is connected between bit line /BL and storage node N2, the gate thereof being connected to word line WL.

At writing operation, word line WL is set to the H level of the selective level, rendering N-channel MOS transistors 19, 20 conductive. If bit lines BL, /BL are set to the H level and the L level respectively, P-channel MOS transistor 13 is rendered non-conductive while N-channel MOS transistor 17 is rendered conductive, node N3 having the L level, storage node N1 being latched at the H level. Further, P-channel MOS transistor 14 is rendered conductive while N-channel MOS transistor 18 is rendered non-conductive, node N4 having the H level, storage node N2 being latched at the L level.

If bit lines BL, /BL are set to the L level and the H level respectively, P-channel MOS transistor 14 is rendered non-conductive while N-channel MOS transistor 18 is rendered conductive, node N4 having the L level, storage node N2 being latched at the H level. Further, P-channel MOS transistor 13 is rendered conductive while N-channel MOS transistor 17 is rendered non-conductive, node N3 having the H level, storage node N1 being latched at the L level.

If bit lines BL, /BL are both set to the H level, P-channel MOS transistors 13, 14 are rendered non-conductive while N-channel MOS transistors 17, 18 are rendered conductive, nodes N3, N4 having the L level, storage nodes N1, N2 being latched at the H level. If word line WL is set to the L level of the non-selective level, N-channel MOS transistors 19, 20 are rendered non-conductive, and a ternary data signal is stored into memory cell 1. Storage nodes N1, N2 having the L level and the H level, i.e. 0 and 1, assume "0," storage nodes N1, N2 having the H level and the L level, i.e. 1 and 0, assume "1," and storage nodes N1, N2 having the H level and the H level, i.e. 1 and 1, assume "x."

At reading operation, word line WL is set to the H level of the selective level, rendering N-channel MOS transistors 19, 20 conductive. If storage nodes N1, N2 are at the H level and the L level respectively, current flows out from bit line /BL through N-channel MOS transistors 20, 16 onto the line of ground potential GND, lowering the potential of bit line /BL. The potential of bit line BL remains at the precharge potential, since N-channel MOS transistor 15 is out of conduction.

If storage nodes N1, N2 have the L level and the H level respectively, current flows out from bit line BL through N-channel MOS transistors 19, 15 onto the line of ground potential GND, lowering the potential of bit line BL. The potential of bit line /BL remains at the precharge potential, since N-channel MOS transistor 16 is out of conduction.

If storage nodes N1, N2 are both at the H level, bit lines BL, /BL remains at the precharge potential, since N-channel MOS transistors 15, 16 are both out of conduction.

Figure 3:
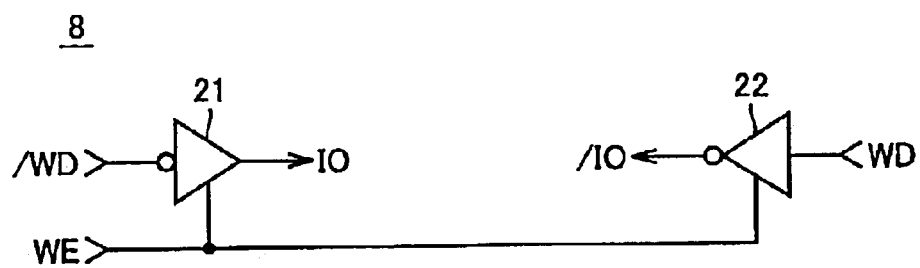
FIG. 3 is a circuit diagram illustrating the configuration of a write circuit shown in FIG. 1.

FIG. 3 is a circuit diagram showing the configuration of write circuit 8. In FIG. 3, write circuit 8 includes tristate inverters 21, 22. Inverter 21 is activated when write enable signal WE is at the H level of the activated level, to output an inversion signal of a write data signal /WD to data input/output line IO. Inverter 22 is activated when signal WE is at the H level of the activated level, to output an inversion signal of a write data signal WD to data input/output line /IO. If signal WE is at the L level of the inactivated level, output nodes of inverters 21, 22 come to be in a high impedance state.

At writing operation, signal WE is set to the H level at a prescribed timing, activating inverters 21, 22. If write data signals WD, /WD are (0, 1), (1, 0) and (1, 1), data input/output lines IO, /IO have (0, 1), (1,0) and (1,1) respectively, and data signals WD, /WD are written. At reading operation, signal WE is fixed at the L level of the activated level, and the output nodes of inverters 21, 22 are maintained in the high impedance state.

Figure 4:
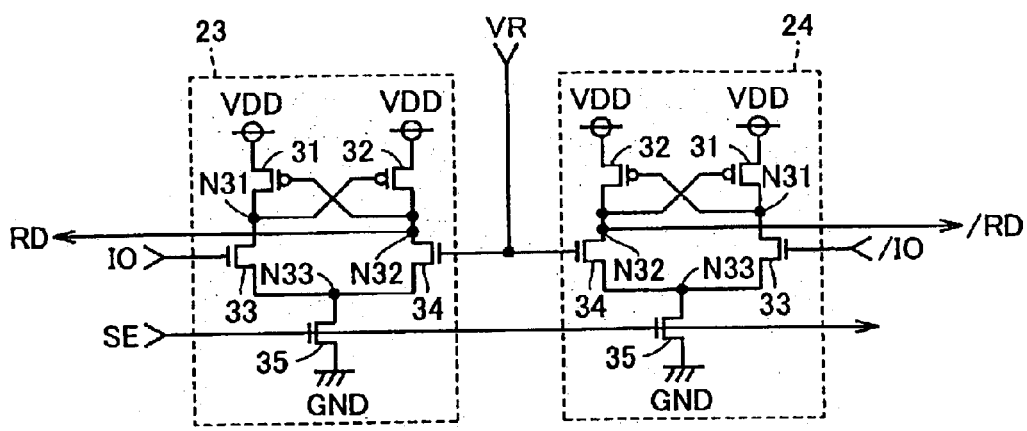
FIG. 4 is a circuit diagram illustrating the configuration of a read circuit shown in FIG. 1.

At reading operation, the potential of each of bit lines BL, /BL is compared with reference potential VR, to read out storage data "0," "1" or "x" in memory cell 1. FIG. 4 is a circuit diagram showing the configuration of read circuit 9. In FIG. 4, read circuit 9 includes two differential amplifiers 23, 24. Differential amplifier 23 includes P-channel MOS transistors 31, 32 and N-channel MOS transistors 33 to 35. P-channel MOS transistors 31, 32 are connected between the lines of power-supply potential VDD and nodes N31, N32, the gates thereof being connected to nodes N32, N31 respectively. N-channel MOS transistors 33, 34 are connected between node N33 and nodes N31, N32 respectively, the gates thereof receiving the potential of data input/output line IO and reference potential VR, respectively. The signal appearing at node N32 is output signal RD of differential amplifier 23. Reference potential VR is a prescribed potential (e.g. VDD/2) between power-supply potential VDD and ground potential GND. N-channel MOS transistor 35 is connected between node N33 and the line of ground potential GND, the gate thereof receiving signal SE.

Differential amplifier 24 has the same configuration as that of differential amplifier 23, including P-channel MOS transistors 31, 32 and N-channel MOS transistors 33 to 35. However, the gate of N-channel MOS transistor 33 receives the potential of data input/output line /IO in place of the potential of data input/output line IO. Further, at node N32, a data signal /RD appears in place of data signal RD. * At reading operation, signal SE is set to the H level at a prescribed timing, rendering N-channel MOS transistor 35 conductive, thereby activating differential amplifiers 23, 24. If data input/output lines IO, /IO are at the H level and the L level respectively, MOS transistors 32, 33 in differential amplifier 23 have a conduction resistance lower than that of MOS transistors 31, 34, setting signal RD to the H level, while MOS transistors 32, 34 in differential amplifier 24 have a conduction resistance higher than that Of MOS transistors 31, 34, setting signal /RD to the L level.

Likewise, if data input/output lines IO, /IO are at the L level and the H level respectively, signals RD, /RD have the L level and the H level respectively. If data input/output lines IO, /IO are both at the H level, signals RD, /RD both have the H level. At writing operation, signal SE is fixed at the L level of the inactivated level, signals RD, /RD both being maintained at the H level.

According to the first embodiment, one memory cell 1 can hold three types of data signals, i.e. "0," "1" and "x." Therefore, compared to the conventional example where two memory cells were required to holds three types of data signals, the number of memory cells are reduced to a half, allowing reduction in the chip area and power consumption.

While read circuit 9 is constituted by two PMOS cross-coupled differential amplifiers 23, 24 in the present embodiment, read circuit 9 may be constituted by two current mirror differential amplifiers. In a differential amplifiers of the current mirror type, the gates of P-channel MOS transistors 31, 32 are both connected to node N32, and a signal appearing at node N31 is inverted at an inverter to be data signal RD or /RD.

Figure 5:
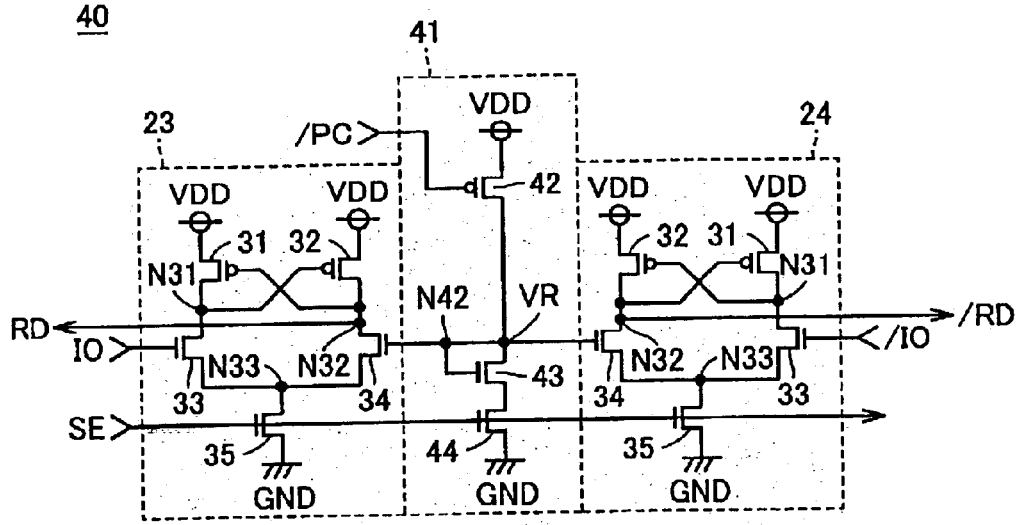
FIG. 5 is a circuit diagram showing a modification of the first embodiment.

Alternatively, read circuit 9 may be replaced by a read circuit 40 in FIG. 5. Read circuit 40 is formed by adding a reference potential generating circuit 41 to read circuit 9. Reference potential generating, circuit 41 includes P-channel MOS transistor 42 and N-channel MOS transistors 43, 44 connected in series between the line of power-supply potential VDD and the line of ground potential GND. The gate of P-channel MOS transistor 42 receives a pre-charge signal /PC. The gate of N-channel MOS transistor 43 is connected to its drain (node N42). A potential appearing at node N42 is reference potential VR. Reference potential VR is applied to the gates of N-channel MOS transistors 34, 34 in differential amplifiers 23, 24 gate of N-channel MOS transistor 44 receives signal SE.

At reading operation, precharge signal /PC is first set to the L level for a predetermined time period, rendering P-channel MOS transistor 42 conductive, node N42 being charged to power-supply potential VDD. Subsequently, signal SE is set to the H level, rendering N-channel MOS transistor 44 conductive and lowering the potential of node N42 to a threshold potential Vth of N-channel MOS transistor 43. Threshold potential Vth is applied to differential amplifiers 23, 24 as reference potential VR. However, the size of N-channel MOS transistors 43, 44 is set such that the potential of node N42 decreases at a rate lower than a rate at which the potential of data input/output lines IO, /IO decreases. According to the modification, reference potential VR can readily be generated.

Second Embodiment

Figure 6:
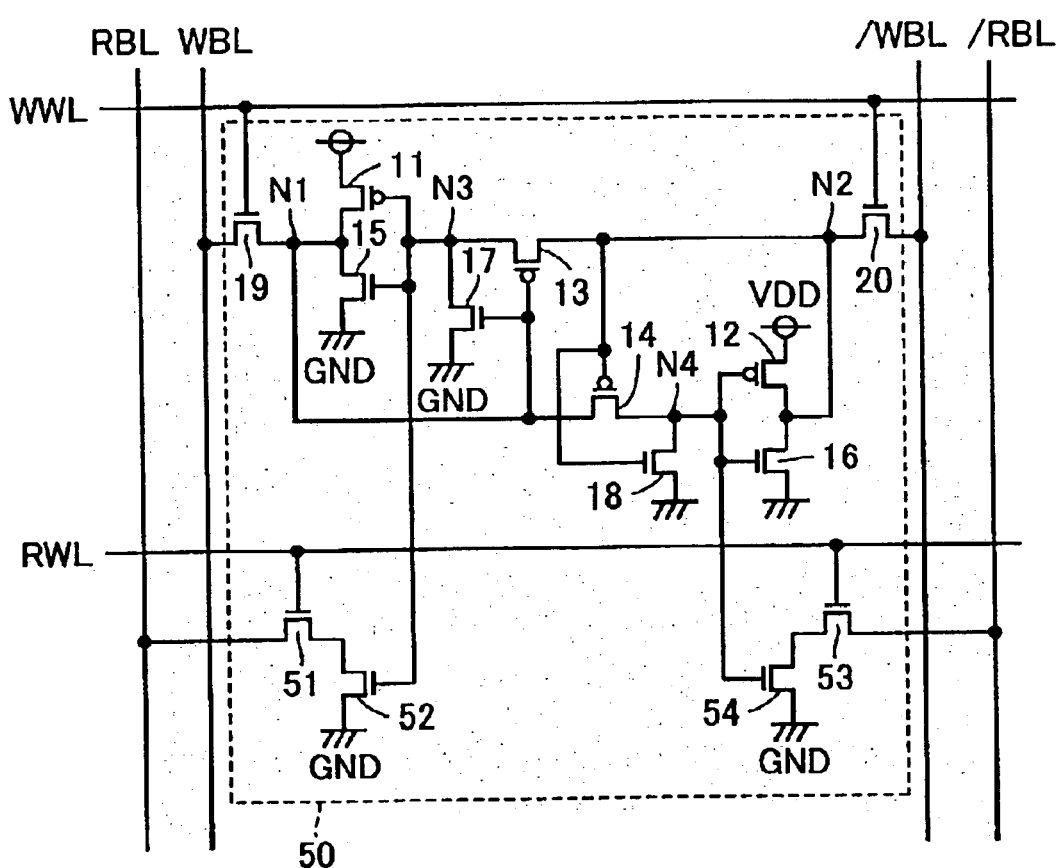
FIG. 6 is a circuit diagram illustrating the configuration of a memory cell in a two-port SRAM according to the second embodiment of the invention.

FIG. 6 is a circuit diagram showing the configuration of a memory cell 50 in a two-port SRAM according to the second embodiment of the present invention. Referring to FIG. 6, memory cell 50 is configured by adding N-channel MOS transistors 51 to 54 to memory cell 1 in FIG. 2. N-channel MOS transistors 51 to 54 form a read circuit. In the two-port SRAM, a write word line WWL and a read word line RWL are provided in correspondence to each memory cell row, whereas a write bit line pair WBL, /WBL and a read bit line pair RBL, /RBL are provided in correspondence to each memory cell column.

N-channel MOS transistor 19 is connected between write bit line WBL and storage node N1, the gate thereof being connected to write word line WWL. N-channel MOS transistor 20 is connected between write bit line /WLB and storage node N2, the gate thereof being connected to write word line WWL. N-channel MOS transistors 51, 52 are connected in series between read bit line RBL and the line of ground potential GND, whereas N-channel MOS transistors 53, 54 are connected in series between read bit line /RBL and the line of ground potential GND. The gates of N-channel MOS transistors 51, 53 are both connected to read word line RWL, while the gates of N-channel MOS, transistors 52, 54 are connected to nodes N3 and N4 respectively.

At writing operation, write word line WWL and write bit line pair, WBL, /WBL are used to write a data signal "0," "1" or "x" into memory cell 50, as in the first embodiment.

At reading operation, read bit lines RBL, /RBL are charged to the H level while read word line RWL are set to the H level of the selective level; rendering N-channel MOS transistors 51, 53 conductive. If storage nodes N1, N2 are at the H level and the L level respectively, nodes N3, N4 have the L level and the H level respectively, rendering N-channel MOS transistor 52 non-conductive and N-channel MOS transistor 54 conductive, read bit lines RBL, /RBL having H level and the L level, respectively.

If storage nodes N1, N2 are at the L level and the H level respectively, nodes N3, N4 have the H level and the L level respectively, rendering N-channel MOS transistor 52 conductive and N-channel MOS transistor 54 non-conductive, read bit lines RBL, /RBL having the L level and the H level, respectively.

If storage nodes N1, N2 are both at the H level, nodes N3 and N4 both have the L level, rendering both N-channel MOS transistors 52 and 54 non-conductive, read bit lines RBL, /RBL remaining at the H level. If read word line RWL is set to the L level of the non-selective level, N-channel MOS transistors 51, 53 are rendered non-conductive, thereby terminating the reading operation.

According to the second embodiment, storage nodes N1 to N4 in memory cell 50 are not directly connected to read bit lines RBL, /RBL, preventing destruction of data at reading operation. Accordingly, data stored in memory cell 50 is stably held.

Third Embodiment

FIG. 7 is a circuit diagram showing the configuration of a memory cell 60 in a CAM according to the third embodiment of the present invention. Referring to FIG. 7, memory cell 60 is configured by adding N-channel MOS transistors 61–64 to memory cell 1 in FIG. 2. N-channel MOS transistors 61–64 form a match/mismatch determination circuit. In this CAM, word line WL is provided in each memory cell row, match line ML is provided per one word, and bit line pair BL, /BL is provided in each memory cell column. N-channel MOS transistors 61, 62 are connected in series between match line ML and the line of ground potential GND, the gates thereof being connected to bit line BL and to storage node N1, respectively. N-channel MOS transistors 63, 64 are connected in series between match line ML and the line of ground potential GND, the gates thereof being connected to bit line /BL and storage node N2, respectively.

As shown in FIG. 8, a precharge circuit 65 and a potential detection circuit 66 are connected to match line ML. At data retrieval, precharge circuit 65 charges match line ML to the H level and applies an inversion signal of a data signal to be retrieved to bit line pair BL, /BL. Potential detection circuit 66 then detects the potential of match line ML. Precharge circuit 65 is connected, for example, between the line of power-supply potential VDD and match line ML, and includes a P-channel MOS transistor 65a with its gate receiving a precharge signal /PCm. If precharge signal /PCm is set to the L level, P-channel MOS transistor 65a is rendered conductive, charging match line ML to the H level. Potential detection circuit 66 includes an inverter 65a that, for example, sets a hit signal ØH to the H level if the potential of match line ML is lower than the threshold potential thereof and sets hit signal ØH to the L level if the potential of match line ML is higher than the threshold potential thereof. Data signals are written/read using word line WL and bit line pair BL, /BL, as in the SRAM of the first embodiment.

FIG. 9 shows the relationship of storage data D1, retrieval data D2 and a logic level of match line ML in memory cell 60. Storage data D1 has three states of "0," "1" and "x." If storage data D1 is "0," "1" and "x," storage nodes (N1, N2) have (0, 1), (1, 0) and (1, 1) respectively. Retrieval data D2 has three states of "0," "1" and "x." If retrieval data D2 is "0," "1" and "x," bit lines (BL, /BL) have (1, 0), (0, 1) and (0, 0), respectively.

If storage data D1 matches with retrieval data D2, at least one of N-channel MOS transistor 61 and 62 are rendered non-conductive while at least one of N-channel MOS transistors 63 and 64 are rendered non-conductive, match line ML remaining at the H level ("1").

If storage data D1 mismatches with retrieval data D2, N-channel MOS transistors 61, 62 or N-channel MOS transistors 63, 64 are rendered conductive, except for the case where retrieval data D2 is "x," match line ML being set to the L level ("0"). If retrieval data D2 is "x," N-channel MOS transistors 61, 63 are rendered non-conductive, match line ML remaining at the H level ("1"). Potential detection circuit 66 detects whether the potential of match line ML is at the L level or the H level, and if match line ML is at the H level, it sets hit signal ØH to the L level to indicate that storage data D1 matches with retrieval data D2.

Thus, if a part of the data in the retrieval data column is masked to be "x," the match retrieval function is masked for the bit set as "x" to assume that it is a match irrespective of storage data, realizing retrieval of ternary data.

Fourth Embodiment

Figures 10, 11, 12:
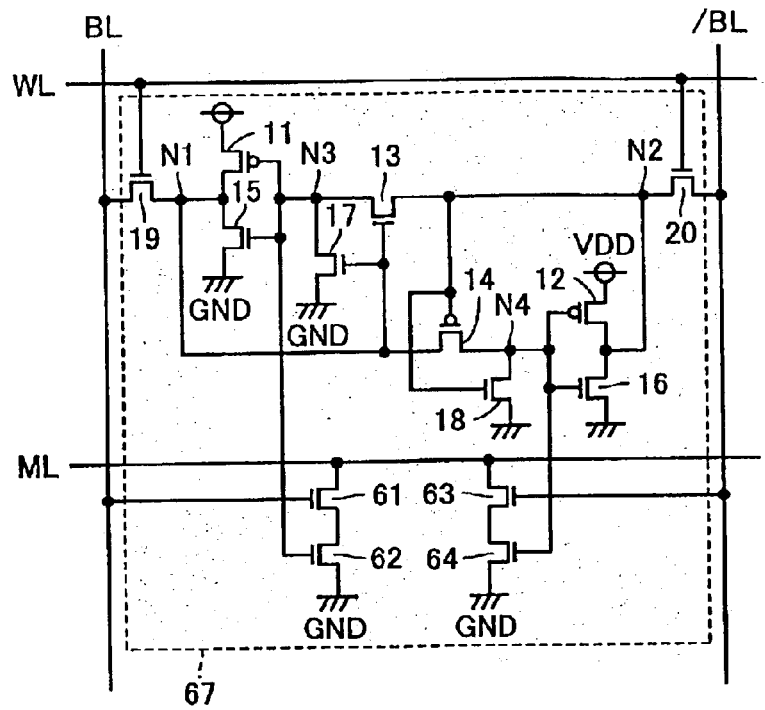
FIG. 10 is a circuit diagram illustrating the configuration of a memory cell in a CAM according to the fourth embodiment of the invention.
FIG. 11 illustrates a data retrieving method for the memory cell shown in FIG. 10.
FIG. 12 shows a modification of the fourth embodiment.

FIG. 10 is a circuit diagram showing the configuration of a memory cell 67 in a CAM according to the fourth embodiment of the present invention. Referring to FIG. 10, memory cell 67 is configured by connecting the gates of N-channel MOS transistors 62, 64 to nodes N3, N4 respectively in memory cell 60 in FIG. 7.

FIG. 11 shows the relationship of storage data D1, retrieval data D2 and a logic level of match line ML in memory cell 67. When storage data D1 assumes "0," "1" and "x," storage nodes (N1, N2) have (0, 1), (1, 0) and (1, 1) respectively, and nodes (N3, N4) have (1, 0), (0,1) and (0, 0) respectively. If retrieval data D2 assumes "0," "1" and "x," bit lines (BL, /BL) have (0, 1), (1,0) and (1,1) respectively.

If storage data D1 matches with retrieval data D2, at least one of N-channel MOS transistors 61 and 62 is rendered non-conductive, while at least one of N-channel MOS transistors 63 and 64 is rendered non-conductive, match line ML remaining at the H level ("1").

If storage data D1 does not match with retrieval data D2, N-channel MOS transistors 61, 62 or N-channel MOS transistors 63, 64 are rendered conductive, except for the case where storage data D1 is "x," match line ML being set to the L level ("0"). If storage data D1 is "x," N-channel MOS transistors 62, 64 are rendered non-conductive, match line ML remaining at the H level ("1").

Thus, if a part of the data in the storage data column is "x," the match retrieval function is masked for the bit of "x" to assume that it is a match irrespective of retrieval data, realizing retrieval of ternary data.

FIG. 12 shows a modification of the fourth embodiment. In the modification shown in FIG. 12, if retrieval data D2 is "x," bit lines (BL, /BL) assume (0, 0). If bit lines (BL, /BL) are (0, 0), N-channel MOS transistors 61, 63 are rendered non-conductive, match line ML being set to the H level irrespective of storage data D1. Therefore, if at least one of retrieval data D2 and storage data D1 is "x," the match retrieval function is masked to assume that it is a match, realizing retrieval of ternary data.

Fifth Embodiment

Figures 13, 14:
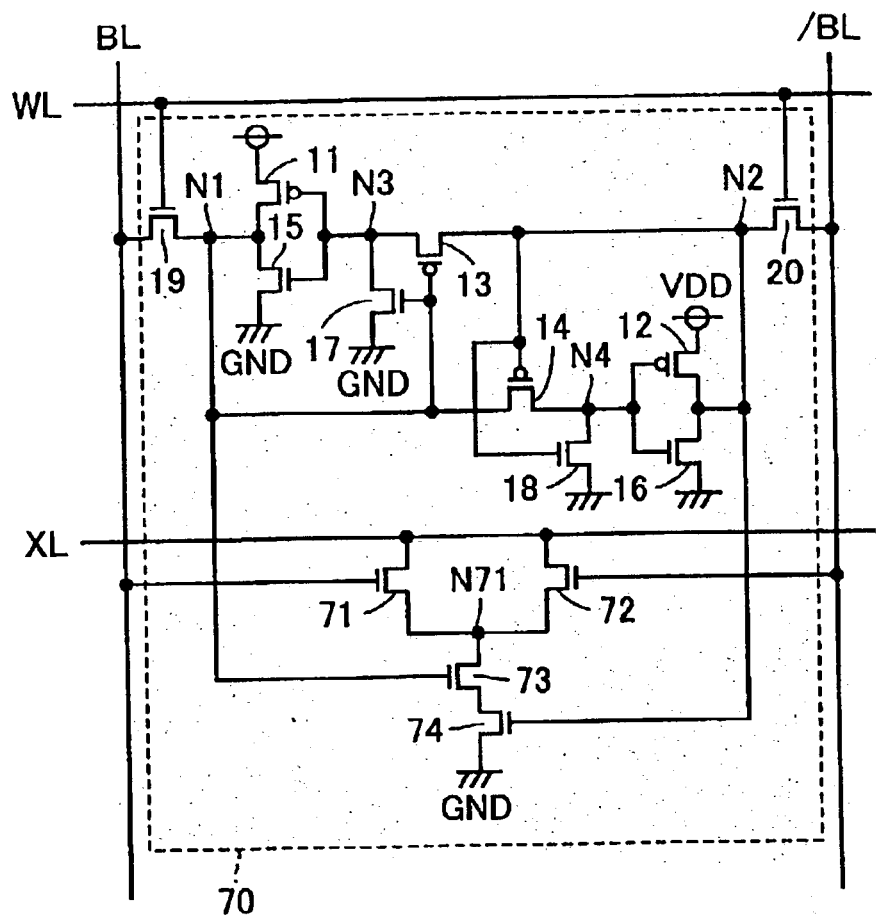
FIG. 13 is a circuit diagram illustrating the configuration of a memory cell in a CAM according to the fifth embodiment of the present invention.
FIG. 14 illustrates a data detecting method for the memory cell shown in FIG. 13.

FIG. 13 is a circuit diagram showing the configuration of a memory cell 70 in a CAM according to the fifth embodiment of the present invention. In FIG. 13, memory cell 70 is configured by adding N-channel MOS-transistors 71–74 to memory cell 1 in FIG. 2. In the SRAM, word line WL is provided in correspondence to each memory cell row, an x detection line XL is provided per word, and bit line pair BL, /BL is provided in correspondence to each memory cell column. N-channel MOS transistors 71 and 72 are connected in parallel between x detection line XL and node N71, the gates thereof being connected to bit lines BL, /BL respectively. N-channel MOS transistors 73 and 74 are connected in series between node N71 and the line of ground potential GND, the gates thereof being connected to storage nodes N1, N2 respectively.

Precharge circuit 65 and potential detection circuit 66 shown in FIG. 8 are connected to x detection line XL. Data signals are written/read using word line WL and bit lines BL, /BL, as in the first embodiment. In data detection, precharge circuit 65 charges x detection line XL to the H level and applies inversion data of data signal D2 to be compared or data in which only "x" of data D2 to be compared is inverted, to bit line pair BL, /BL. Potential detection circuit 66 then detects the potential of x detection line XL.

FIG. 14 shows the relationship of storage data D1, comparison data D2 and a logic level of x detection line XL in memory cell 70. If storage data D1 is "0," "1" or "x," storage nodes (N1, N2) are (0, 1), (1, 0) or (1, 1) respectively. If comparison data D2 has "0," "1" or "x," bit lines (BL, /BL) are (0, 1), (1, 0) or (0, 0); or (1, 0), (0, 1) or (0, 0), respectively.

If storage data D1 is "0" or "1," storage node N1 or N2 is set to the L level, rendering N-channel MOS transistor 73 or 74 non-conductive, x detection line XL remaining at the H level ("1") irrespective of comparison data D2.

If storage data D1 is "x," storage nodes N1, N2 are both set to the H level, rendering both N-channel MOS transistors 73 and 74 conductive. Thus, N-channel MOS transistor 71 or 72 are rendered conductive except for the case where comparison data D2 is "x," and x detection line XL is set to the L level ("0"). If comparison data D2 is "x," N-channel MOS transistors 71, 72 are both rendered non-conductive, and x detection line XL remains at the H level ("1").

Therefore, if there is even one bit of "x" in the data of one word, x detection line XL is lowered to the L level. Only x detection line XL corresponding to the word in which all bits are not "x" is held at the H level. If comparison data D2 is "0" or "1" while storage data D1 is "x," it is assumed that "x" is detected. Combined with N-channel MOS transistors 60–64 and match line ML in the fifth embodiment, it can be determined whether or not "x" is included in a matched storage data column.

Sixth Embodiment

Figure 15:
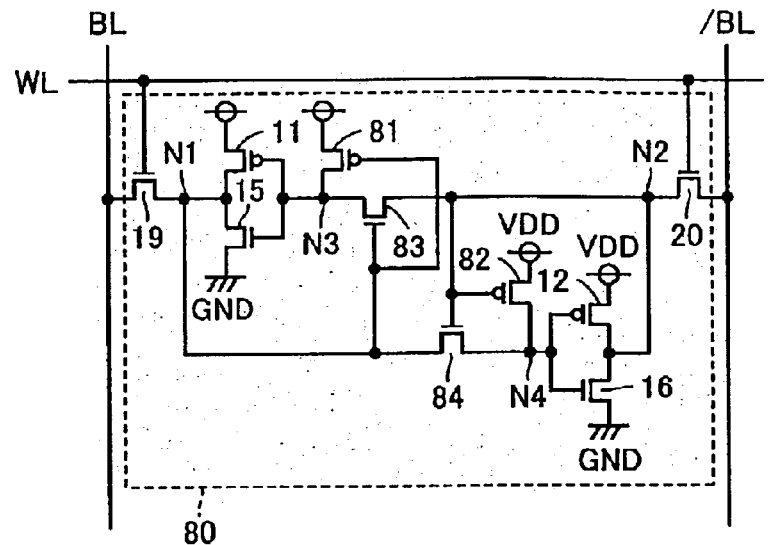
FIG. 15 is a circuit diagram illustrating the configuration of a memory cell in an SRAM according to the sixth embodiment of the present invention.

FIG. 15 is a circuit diagram showing the configuration of a memory cell 80 in an SRAM according to the sixth embodiment of the present invention. Referring to FIG. 15, memory cell 80 is different from memory cell 1 in FIG. 2 in that N-channel MOS transistors 17, 18 are replaced by P-channel MOS transistors (pull up transistors) 81, 82, and that P-channel MOS transistors 13, 14 are replaced by N-channel MOS transistors (transfer gates) 83, 84. P-channel MOS transistors 81 and 82 are connected between the line of power-supply voltage VDD and nodes N3, N4 respectively, the gates thereof being connected to storage nodes N1, N2 respectively. N-channel MOS transistor 83 is connected between nodes N2 and N3, the gate thereof being connected to storage node N1. N-channel MOS transistor 84 is connected between nodes N1 and N4, the gate thereof being connected to, storage node N2.

At writing operation, word line WL is set to the H level of the selective level, rendering N-channel MOS transistors 19, 20 conductive. If bit lines BL, /BL are set to the H level and the L level respectively, N-channel MOS transistor 84 is rendered non-conductive while P-channel MOS transistor 82 is rendered conductive, node N4 being set to the H level, storage node N2 being latched at the L level. Further, N-channel MOS transistor 83 is rendered conductive while P-channel MOS transistor 81 is rendered non-conductive, node N3 being set to the L level, storage node N1 being latched at the H level.

If bit lines BL, /BL are set to the L level and the H level respectively, N-channel MOS transistor 83 is rendered non-conductive while P-channel MOS transistor 81 is rendered conductive, node N3 being set to the H level, storage node N1 being latched at the L level. Further, N-channel MOS transistor 84 is rendered conductive while P-channel MOS transistor 82 is rendered non-conductive, node N4 being set to the L level, storage node N2 being latched at the H level.

If bit lines BL, /BL are both set to the L level, N-channel MOS transistors 83, 84 are rendered non-conductive while P-channel MOS transistors 81, 82 are rendered conductive, nodes N3, N4 being set to the H level, storage nodes N1, N2 being latched at the L level. If word line WL is set to the L level of the non-selective level, N-channel MOS transistors 19, 20 are rendered non-conductive, and a ternary data signal is stored into memory cell 80. Storage nodes N1, N2 having the L level and the H level, i.e. 0 and 1, assumes "0," storage nodes N1, N2 having the H level and the L level, i.e. 1 and 0, assumes "1," and storage nodes N1, N2 having the L level and the L level, i.e. 0 and 0, assumes "x."

At reading operation, word line WL is set to the H level of a selective level, rendering N-channel MOS transistors 19, 20 conductive. If storage nodes N1, N2 are at the H level and the L level respectively, current flows out from bit line /BL through N-channel MOS transistors 20, 16 onto the line of ground potential GND, lowering the potential of bit line /BL. The potential of bit line BL remains at the precharge potential, since N-channel MOS transistor 15 is out of conduction.

If storage nodes N1, N2 are at the L level and the H level respectively, current flows out from bit line BL through N-channel MOS transistors 19, 15 onto the line of ground potential GND, lowering the potential of bit line BL. The potential of bit line /BL remains at the precharge potential, since N-channel MOS transistor 16 is out of conduction. If storage nodes N1, N2 are both at the L level, N-channel MOS transistors 15, 16 are both in conduction, so that the potentials of bit lines BL, BL are both at the L level. Thus, by comparing the potential of each of bit lines BL, BL with reference potential VR, storage data "0," "1" or "x" in memory cell 80 can be read out.

The same effect as that of the first embodiment can also be obtained in the sixth embodiment.

Seventh Embodiment

Figure 16:
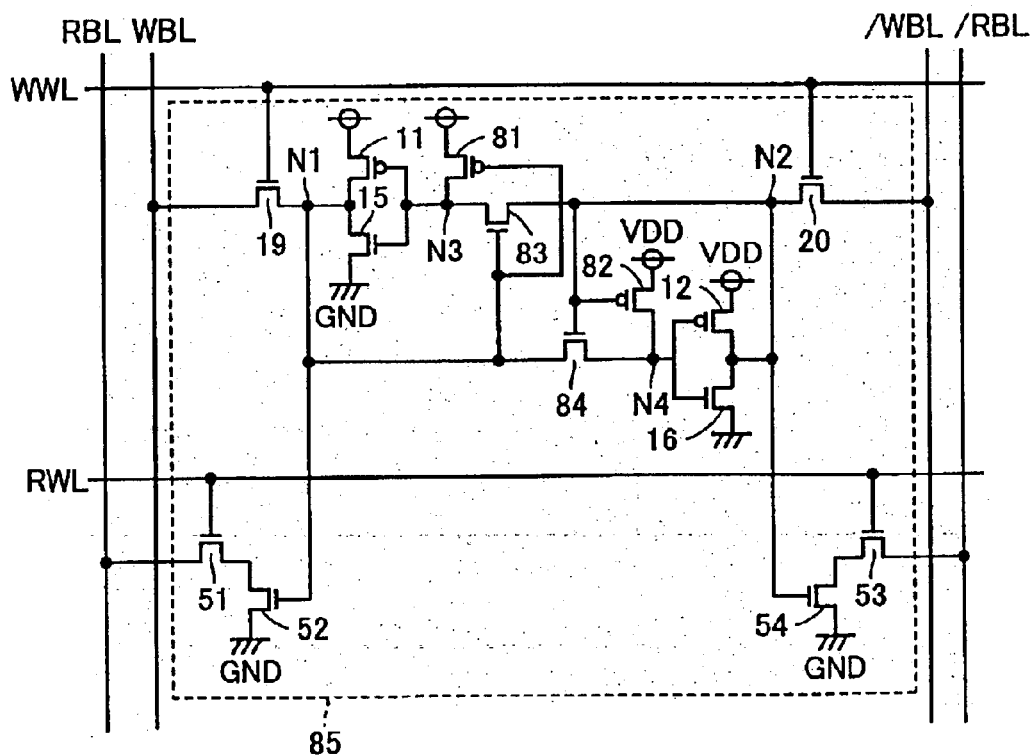
FIG. 16 is a circuit diagram illustrating the configuration of a memory cell in a two-port SRAM according to the seventh embodiment of the present invention.

FIG. 16 is a circuit diagram showing the configuration of a memory cell 85 in a two-port SRAM according to the seventh embodiment of the present invention. Referring to FIG. 16, memory cell 85 is provided with a read circuit constituted by N-channel MOS transistors 51 to 54 shown in FIG. 6 in memory cell 80 shown in FIG. 15. However, the gates of N-channel MOS transistors 52, 54 are connected to storage nodes N1, N2 in place of nodes N3, N4. This is because the connection of the gates of N-channel MOS transistors 52, 54 to nodes N3, N4 renders both N-channel MOS transistors 52 and 54 conductive when storage nodes N1, N2 assume (0, 0), lowering both read bit lines RBL and /RBL to the L level, thereby increasing power consumption. Therefore, a read data signal output onto read bit lines RBL, /RBL is an inversion signal of a storage data signal.

At writing operation, write word line WL and write bit line pair WBL, /WBL are used to write data signals "0," "1" or "x" into memory cell 85, as in the sixth embodiment.

At reading operation, read word line RWL is set to the H level of the selective level, rendering N-channel MOS transistors 51 and 53 conductive. If storage nodes N1, N2 have 1, 0 respectively, N-channel MOS transistor 52 is rendered conductive while N-channel MOS transistor 54 is rendered non-conductive, read bit lines RBL, /RBL being 0, 1 respectively.

If storage nodes N1, N2 have 0, 1, N-channel MOS transistor 52 is rendered non-conductive while N-channel MOS transistor 54 is rendered conductive, read bit lines RBL, /RBL having 1, 0 respectively. If storage nodes N1, N2 have 0, 0 respectively, both N-channel MOS transistors 52 and 54 are rendered non-conductive, read bit lines RBL, /RBL having 1, 1 respectively. Thus, according to the seventh embodiment, inversion data of the storage data is read out onto read bit lines RBL, /RBL. If read word line RWL is set to the L level of the non-selective level, N-channel MOS transistors 51, 53 are rendered non-conductive, thereby terminating the reading operation.

The same effect as that in the second embodiment can also be obtained in the seventh embodiment.

Eighth Embodiment

Figures 17, 18:
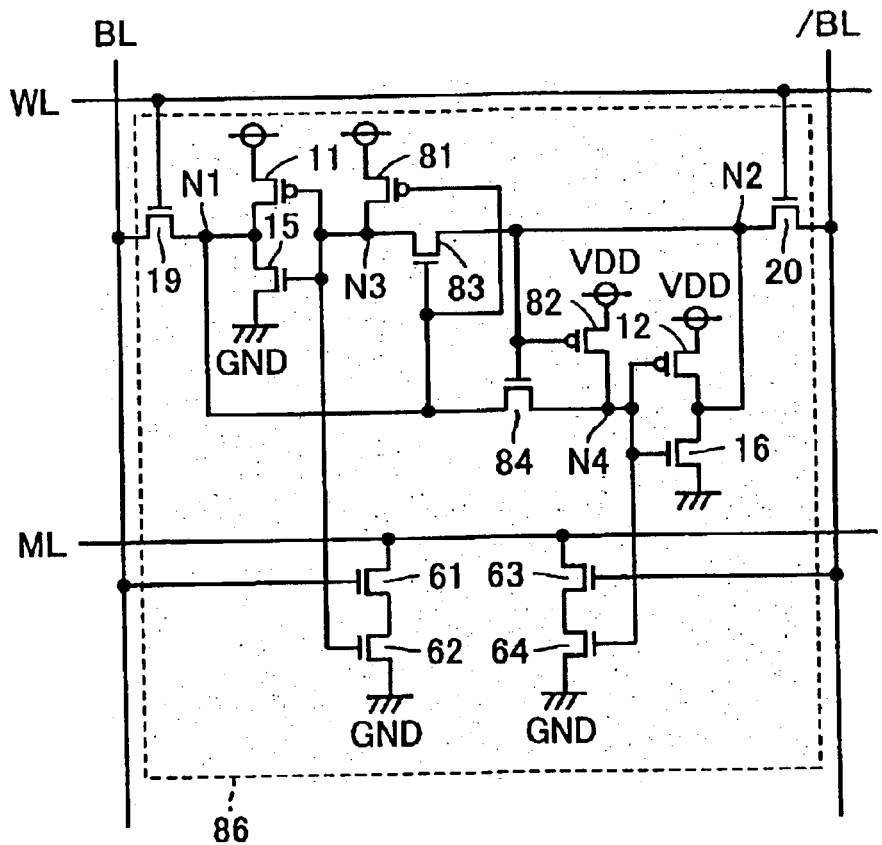
FIG. 17 is a circuit diagram illustrating the configuration of a memory cell in a CAM according to the eighth embodiment of the present invention.
FIG. 18 illustrates a data retrieving method for the memory cell shown in FIG. 17.

FIG. 17 is a circuit diagram showing the configuration of a memory cell 86 of a CAM according to the eighth embodiment. Referring to FIG. 17, memory cell 86 is configured by adding the match/mismatch determination circuit constituted by N-channel MOS transistors 61–64 shown in FIG. 7 to memory cell 80 shown in FIG. 15. That is, the CAM includes word line WL in each memory cell row, match line ML per one word, and bit line pair BL, /BL in each memory cell column. N-channel MOS transistors 61 and 62 are connected in series between match line ML and the line of ground potential GND, the gates thereof being connected to bit line BL and node N3, respectively. N-channel MOS transistors 63 and 64 are connected in series between match line ML and the line of ground potential GND, the gates thereof being connected to bit line /BL and node N4, respectively.

Precharge circuit 65 and potential detection circuit 66 shown in FIG. 8 are connected to match line ML. Data signals are written/read using word line WL and bit line pair BL, /BL, as in the SRAM of the sixth embodiment. At data retrieval, precharge circuit 65 charges match line ML to the H level and applies a data signal to be retrieved to bit line pair BL, /BL. Potential detection circuit 66 then detects the potential of match line ML.

FIG. 18 shows the relationship of storage data D1, retrieval data D2 and a logic level of match line ML in memory cell 86. When storage data D1 is "0," "1" or "x," storage nodes (N1, N2) are (0, 1), (1, 0) or (0, 0) respectively, while nodes (N3, N4) are (1, 0), (0, 1) or (1, 1), respectively. If retrieval data D2 is "0," "1" or "x," bit lines (BL, /BL) are (0, 1), (1, 0) or (0, 0) respectively.

If storage data D1 matches with retrieval data D2, at least one of N-channel MOS transistors 61 and 62 is rendered non-conductive, while at least one of N-channel MOS transistors 63 and 64 is rendered non-conductive, match line ML remaining at the H level ("1").

If storage data D1 does not match with retrieval data D2, N-channel MOS transistors 61, 62 or N-channel MOS transistors 64, 65 are rendered conductive, except for the case where retrieval data D2 is "x," match line ML being set to the L level ("0"). If retrieval data D2 is "x," N-channel MOS transistors 61, 63 are rendered non-conductive, match line ML remaining at the H level ("1"). Potential detection circuit 66 detects whether the potential of match line ML is at the L level or the H level, and if match line ML is at the H level, it sets hit signal φH to the H level to indicate that storage data D1 matches with retrieval data D2.

Therefore, if a part of the data in the retrieval data column is masked to be "x," the match retrieval function is masked to assume that the bit set as "x" as a match irrespective of storage data, thereby realizing retrieval of ternary data.

Ninth Embodiment

Figures 19, 20, 21:
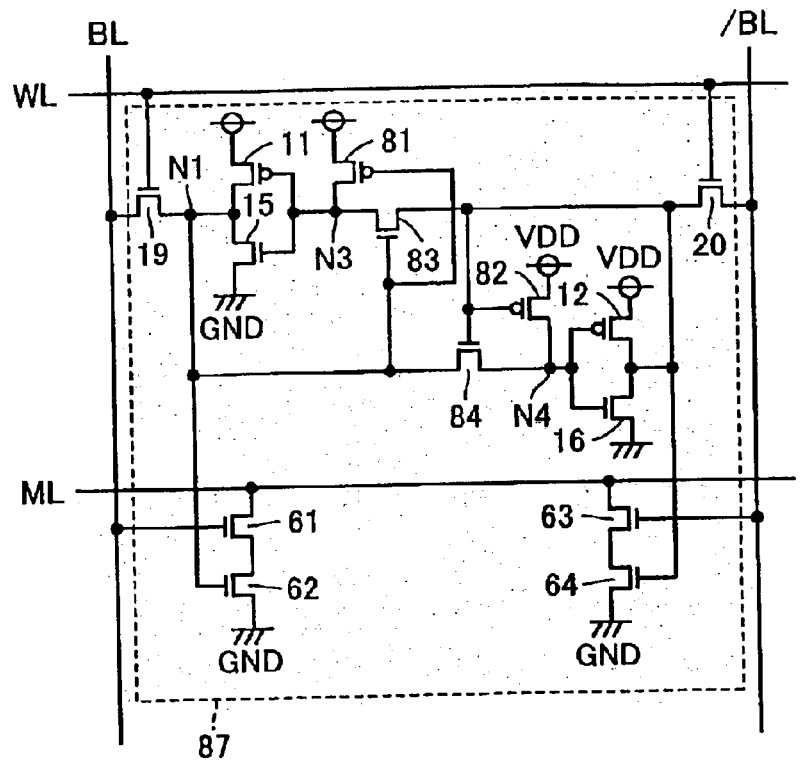
FIG. 19 is a circuit diagram illustrating the configuration of a memory cell in a CAM according to the ninth embodiment of the present invention.
FIG. 20 illustrates a data retrieving method for the memory cell shown in FIG. 19.
FIG. 21 shows a modification of the ninth embodiment.

FIG. 19 is a circuit diagram showing the configuration of a memory cell 87 in a CAM according to the ninth embodiment of the present invention. In FIG. 19, memory cell 87 is configured by connecting the gates of N-channel MOS transistors 62, 64 to storage nodes N1, N2 respectively, in memory cell 86 shown in FIG. 17.

FIG. 20 shows the relationship of storage data D1, retrieval data D2 and a logic level of match line ML in memory cell 87. If storage data D1 is "0," "1" or "x," storage nodes (N1, N2) have (0, 1), (1, 0) or (0, 0) respectively. If retrieval data D2 is "0," "1" or "x," inversion data of retrieval data D2 is applied to bit lines (BL, /BL), and bit lines (BL, /BL) have (1, 0), (0, 1) or (1, 1) respectively.

If storage data D1 matches with retrieval data D2, at least one of N-channel MOS transistors 61, 62 is rendered non-conductive, while at least one of N-channel MOS transistors 63, 64 is rendered non-conductive, match line ML remaining at the H level ("1"). If storage data D1 does not match with retrieval data D2, N-channel MOS transistors 61, 62 or N-channel MOS transistors 63, 64 are rendered conductive, except for the case where storage data D1 is "x," match line ML being set to the L level ("0"). If storage data D1 is "x," N-channel MOS transistors 62, 64 are rendered non-conductive, match line ML remaining at the H level ("1").

Therefore, if there is "x" in a part of the data in the storage data column, the match retrieval function is masked to assume the bit of "x" as a match irrespective of retrieval data, thereby realizing retrieval of ternary data.

FIG. 21 shows a modification of the ninth embodiment. Referring to FIG. 21, in this modification, if retrieval data D2 is "x," bit lines (BL, /BL) assume (0, 0). If bit lines (BL, /BL) are (0, 0), N-channel MOS transistors 61, 63 are rendered non-conductive, match line ML being set to the H level irrespective of storage data D1. Accordingly, if at least one of retrieval data D2 and storage data D1 is "x," the match retrieval function is masked to assume that bit as a match, thereby realizing retrieval of ternary data.

Tenth Embodiment

Figures 22, 23:
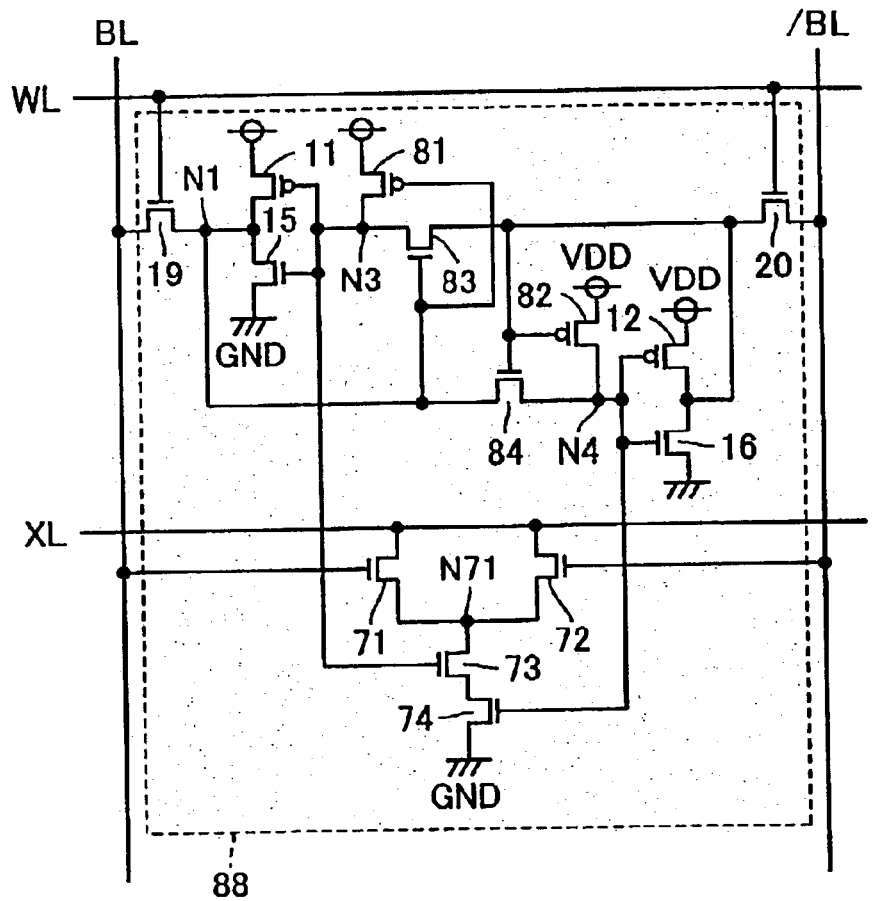
FIG. 22 is a circuit diagram illustrating the configuration of a memory cell in a CAM according to the tenth embodiment of the present invention.
FIG. 23 illustrates a data detecting method for the memory cell shown in FIG. 22.
Figure 24:
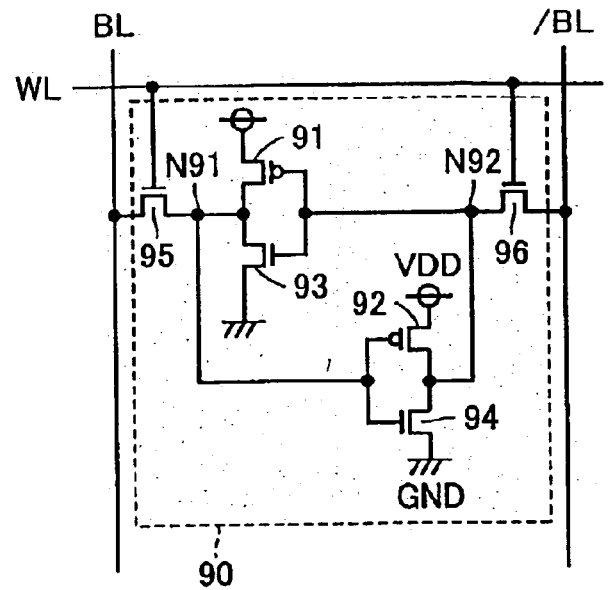
FIG. 24 is a circuit diagram illustrating the configuration of the memory cell in the conventional SRAM.
Figure 25:
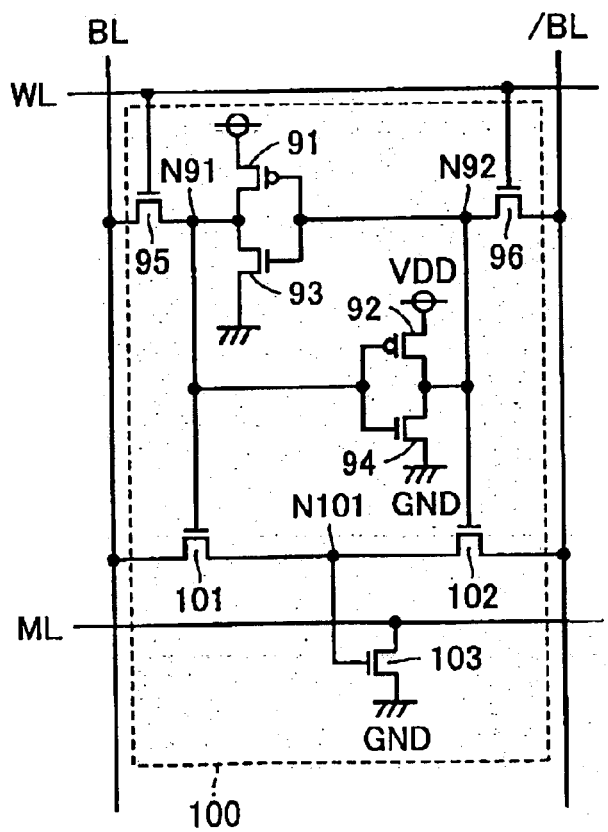
FIG. 25 is a circuit diagram illustrating the configuration of the memory cell in the conventional CAM.

FIG. 22 is a circuit diagram showing the configuration of a memory cell 88 in a CAM according to the tenth embodiment of the present invention. In FIG. 22, memory cell 88 is configured by adding the x detection circuit constituted by N-channel MOS transistors 71–74 shown in FIG. 13 to memory cell 80 shown in FIG. 15. In the CAM, word line WL is provided in each memory cell row, x detection line XL is provided per word, and bit line pair BL, /BL is provided in correspondence to each memory cell column. N-channel MOS transistors 71 and 72 are connected in parallel between x detection line XL and node N71, the gates thereof being connected to bit lines BL, /BL respectively. N-channel MOS transistors 73 and 74 are connected in series between node N71 and the line of ground potential GND, the gates thereof being connected to nodes N3, N4 respectively.

Precharge circuit 65 and potential detection circuit 66 shown in FIG. 8 are connected to x detection line XL. Data signals are written/read using word line WL and bit line pair BL, /BL, as in the sixth embodiment. In data retrieval, precharge circuit 65 charges x detection line XL to the H level and applies data D2 to be compared or data in which only "0" and "1" of data D2 to be compared are inverted, to bit line pair BL, /BL. Potential detection circuit 66 then detects the potential of x detection line XL.

FIG. 23 shows the relationship of storage data D1, comparison data D2 and a logic level of x detection line XL in memory cell 88. If storage data D1 is "0," "1" or "x," storage nodes (N1, N2) have (0, 1), (1, 0) or (0, 0) respectively, whereas nodes (N3, N4) have (1, 0), (0, 1) or (1, 1) respectively. If comparison data D2 is "0," "1" or "x," bit lines (BL /BL) have (0, 1), (1, 0) or (0, 0); or (1, 0), (0, 1) or (0, 0), respectively.

If storage data D1 is "0" or "1," node N3 or N4 is set to the L level, rendering N-channel MOS transistor 73 or 74 non-conductive, x detection line XL remaining at the H level ("1"), irrespective of comparison data D2.

If storage data D1 is "x," both nodes N3 and N4 are set to the H level, rendering both N-channel MOS transistors 73 and 74 conductive. Thus, N-channel MOS transistor 71 or 72 is rendered conductive to set x detection line XL to the L level ("0"), except for comparison data D2 being "x." If comparison data D2 is "x," both N-channel MOS transistors 70 and 72 are rendered non-conductive, x detection line XL remaining at the H level ("1").

Accordingly, if there is even one bit of "x" in the data of one word, x detection line XL is lowered to the L level. Only x detection line XL corresponding to the word in which all bits are not "x" is held at the H level. Only when comparison data D2 is "0" or "1" while storage data D1 is "x," it is assumed that "x" is detected. Combined with N-channel MOS transistors 61–64 and match line ML in the ninth embodiment, it can be determined whether or not "x" is included in a matched storage data column.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device arranged at a crossing of a word line and first and second bit lines, comprising:
   first and second inverters having output nodes connected to first and second storage nodes, respectively;
   a first switching circuit
      rendering conductive a path between the first storage node and an input node of said second inverter and applying a second potential to an input node of said first inverter if first and second potentials are applied to the first and second storage nodes, respectively, and
      rendering conductive a path between the second storage node and the input node of said first inverter and applying the second potential to the input node of said second inverter if the second and first potentials are applied to the first and second storage nodes, respectively, and applying the second potential to each of the input nodes of said first and second inverters if the first potential is applied to each of the first and second storage nodes; and
   a second switching circuit rendering conductive a path between the first bit line and the first storage node and between the second bit line and the second storage node, when the word line is set to a selected level.

2. The semiconductor memory device according to claim 1, wherein
   the first and second potentials are a power-supply potential and a ground potential, respectively; and
   said first switching circuit includes
      a first P-channel MOS transistor connected between the first storage node and the input node of said second inverter and having a gate electrode connected to the second storage node,
      a second P-channel MOS transistor connected between the second storage node and the input node of said first inverter and having a gate electrode connected to the first storage node,
      a first N-channel MOS transistor connected between the input node of said first inverter and a line at the ground potential, and having a gate electrode connected to said first storage node, and
      a second N-channel MOS transistor connected between the input node of said second inverter and the line at the ground potential, and having a gate electrode connected to the second storage node.

3. The semiconductor memory device according to claim 1, wherein
   the first and second potentials are a ground potential and a power-supply potential respectively; and
   said first switching circuit includes
      a first N-channel MOS transistor connected between the first storage node and the input node of said second inverter, and having a gate electrode connected to the second storage node,
      a second N-channel MOS transistor connected between the second storage node and the input node of said first inverter, and having a gate electrode connected to the first storage node,
      a first P-channel MOS transistor connected between the input node of said first inverter and a line at the power-supply potential, and having a gate electrode connected to the first storage node, and
      a second P-channel MOS transistor connected between the input node of said second inverter and the line at the power-supply potential, and having a gate electrode connected to the second storage node.

4. The semiconductor memory device according to claim 1, further comprising a read word line, first and second read bit lines, and a read circuit activated in response to said read word line being set to the selected level and reading a data signal held at the first and second storage nodes to apply the data signal to said first and second read bit lines.

5. The semiconductor memory device according to claim 4, wherein
   said first and second read bit lines are pre-charged to a power-supply potential, and
   said read circuit includes
      first and second N-channel MOS transistors connected in series between said first read bit line and a line at the ground potential, one of said first and second N-channel MOS transistors having a gate electrode connected to said read word line, the other of said first and second N-channel MOS transistors having a gate electrode connected to the input node of said first inverter, and
      third and fourth N-channel MOS transistors connected in series between said second read bit line and the line at the ground potential, one of said third and fourth N- channel MOS transistors having a gate electrode connected to said read word line, the other of said third and fourth N-channel MOS transistors having a gate electrode connected to the input node of said second inverter.

6. The semiconductor memory device according to claim 4, wherein
said first and second read bit lines are pre-charged to a power-supply potential; and
said read circuit includes
first and second N-channel MOS transistors connected in series between said first read bit line and a line at the ground potential, one of said first and second N-channel MOS transistors having a gate electrode connected to said read word line, the other of said first and second N-channel MOS transistors having a gate electrode connected to said first storage node, and
third and fourth N-channel MOS transistors connected in series between said second read bit line and the line at the ground potential, one of said third and fourth N- channel MOS transistors having a gate electrode connected to said read word line, the other of said third and fourth N-channel MOS transistors having a gate electrode connected to said second storage node.

7. The semiconductor memory device according to claim 1, further comprising a match line, and a match/mismatch determination circuit determining whether a data signal held at the first and second storage nodes matches a data signal applied to the first and second bit lines, and applying a signal, having a level in accordance with a determination by said match/mismatch determination circuit, to said match line.

8. The semiconductor memory device according to claim 7, wherein said match/mismatch-determination circuit determines that the data signal held at the first and second storage nodes matches the data signal applied to the first and second bit lines if at least one of (i) the first and second storage nodes have identical potentials and (ii) the first and second bit lines have identical potential.

9. The semiconductor memory device according to claim 7, wherein
said match line is pre-charged to a power-supply potential; and
said match/mismatch determination circuit includes
first and second N-channel MOS transistors connected in series between said match line and a line at ground potential, one of said first and second N-channel MOS transistors having a gate electrode connected to the first bit line, the other one of said first and second N-channel MOS transistors having a gate electrode connected to the first storage node, and
third and fourth N-channel MOS transistors connected in series between said match line and the line at the ground potential, one of said third and fourth N-channel MOS transistors having a gate electrode connected to the second bit line, the other one of said third and fourth N-channel MOS transistors having a gate electrode connected to the second storage node.

10. The semiconductor memory device according to claim 7, wherein
said match line is pre-charged to a power-supply potential; and
said match/mismatch determination circuit includes
first and second N-channel MOS transistors connected in series between said match line and a line at ground potential, one of said first and second N-channel MOS transistors having a gate electrode connected to the first bit line, the other one of said first and second N-channel MOS transistors having a gate electrode connected to an input node of said first inverter, and
third and fourth N-channel MOS transistors connected in series between said match line and the line at the ground potential, one of said third and fourth N-channel MOS transistors having a gate electrode connected to the second bit line, the other one of said third and fourth N-channel MOS transistors having a gate electrode connected to an input node of said second inverter.

11. The semiconductor memory device according to claim 1, further comprising a data detection line, and a data detection circuit determining whether both of the first and second storage nodes hold the first potential, and applying a signal, having a level in accordance with a determination by said data detection circuit, to said data detection line.

12. The semiconductor memory device according to claim 11, wherein
the first and second potentials are a power-supply potential and a ground potential, respectively;
said data detection line is pre-charged to the power-supply potential; and
said data detection circuit includes
first and second N-channel MOS transistors having first electrodes connected to said data detection line, second electrodes connected to each other, and gate electrodes connected to the first and second bit lines, respectively, and
third and fourth N-channel MOS transistors connected in series between the second electrodes of said first and second N-channel MOS transistors and a line at the ground potential, and having gate electrodes connected to the first and second storage nodes, respectively.

13. The semiconductor memory device according to claim 11, wherein
said first and second potentials are a ground potential and a power-supply potential, respectively;
said data detection line is pre-charged to the power-supply potential; and
said data detection circuit includes
first and second N-channel MOS transistors having first electrodes connected to said data detection line, second electrodes connected to each other, and gate electrodes connected to the first and second bit lines, respectively, and
third and fourth N-channel MOS transistors connected in series between the second electrodes of said first and second N-channel MOS transistors and a line at the ground potential, and having gate electrodes connected to input nodes of said first and second inverters, respectively.

14. The semiconductor memory device according to claim 1, further comprising a write circuit connected to the first and second bit lines and writing a data signal to the first and second storage nodes in said semiconductor memory device, said write circuit including
a first tristate inverter applying an inversion of a first input signal to the first bit line if a write enable signal is at an activation level, and having an output node set to a high impedance state if the write enable signal is at an inactivated level, and
a second tristate inverter applying an inversion of a second input signal to the second bit line if the write enable signal is at an activated level, and having an output node set to a high impedance state if the writing enable signal is at an inactivated level.

15. The semiconductor memory device according to claim 1, further comprising a read circuit connected to the first and second bit lines and reading a data signal held at the first and second storage nodes in said semiconductor memory device, said read circuit including a first comparison circuit comparing a potential of the first bit line with a reference potential between the first and second potentials, and outputting a signal at a level in accordance with a comparison by said first comparison circuit, and a second comparison circuit comparing a potential of the second bit line with the reference potential and outputting a signal having a level in accordance with a comparison by said second comparison circuit.

16. The semiconductor memory device according to claim 15, further comprising a reference potential generating circuit generating the reference potential, said reference potential generating circuit including a switching element connected between a line at a power-supply potential and an output node, and rendered conductive in a reading operation, and a diode element connected between the output node and a line at ground potential.

* * * * *